United States Patent [19]

Fujii et al.

[11] Patent Number: 5,110,408

[45] Date of Patent: May 5, 1992

[54] PROCESS FOR ETCHING

[75] Inventors: Takashi Fujii; Hironobu Kawahara; Kazuo Takata; Masaharu Nishiumi; Noriaki Yamamoto, all of Kudamatsu, Japan

[73] Assignee: Hitachi, Ltd., Tokyo, Japan

[21] Appl. No.: 658,254

[22] Filed: Feb. 20, 1991

[51] Int. Cl.$^5$ .............. H01L 21/306; B44C 1/22; C23F 1/02; C03C 15/00

[52] U.S. Cl. .............. 156/643; 156/646; 156/656; 156/657; 156/659.1; 156/345; 204/192.37; 252/79.1; 437/233; 437/245

[58] Field of Search .............. 156/643, 646, 653, 656, 156/657, 659.1, 661.1, 345; 204/192.32, 192.35, 192.37; 252/79.1; 427/38, 39; 437/40, 41, 190, 191, 192, 193, 233, 245

[56] References Cited

U.S. PATENT DOCUMENTS

| | | | |
|---|---|---|---|
| 4,473,435 | 9/1984 | Zaffropoulo et al. | 252/79.1 X |
| 4,713,141 | 12/1987 | Tsang | 156/643 |
| 4,741,799 | 5/1988 | Chen et al. | 156/643 |

Primary Examiner—William A. Powell
Attorney, Agent, or Firm—Antonelli, Terry, Stout & Kraus

[57] ABSTRACT

The present invention relates to the etching of a gate film, a tungsten film, a silicon film, etc. In the present invention, use is made of an etching gas comprising a mixture composed of a reductive fluoride gas, a hydrocarbon gas and a halogen gas having a larger atomic diameter than a material to be etched, or a mixture composed of a reductive fluoride gas and a Cl-containing hydrocarbon gas, and the process comprises the step of conducting anisotropic etching of a material to be etched with an etching gas (a reductive fluoride gas), the step of forming a protective film by a depositing gas (a hydrocarbon gas), and the step of removing excess deposits formed as the protective film by means of a gas reactive with the protective film (a halogen gas or a Cl-containing hydrogen gas), wherein anisotropic etching is conducted by forming a protective film on a side wall while removing excess deposits formed as the protective film, thus enabling the anisotropic etching to be conducted with good accuracy.

27 Claims, 4 Drawing Sheets

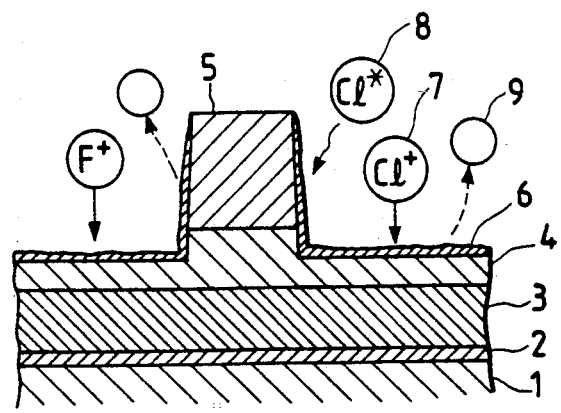
FIG. 1(a)
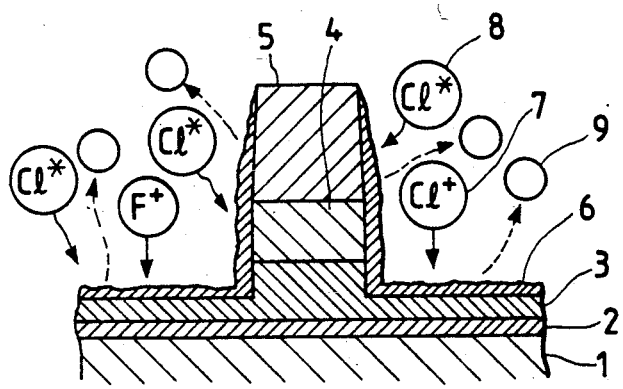
FIG. 1(b)
FIG. 2
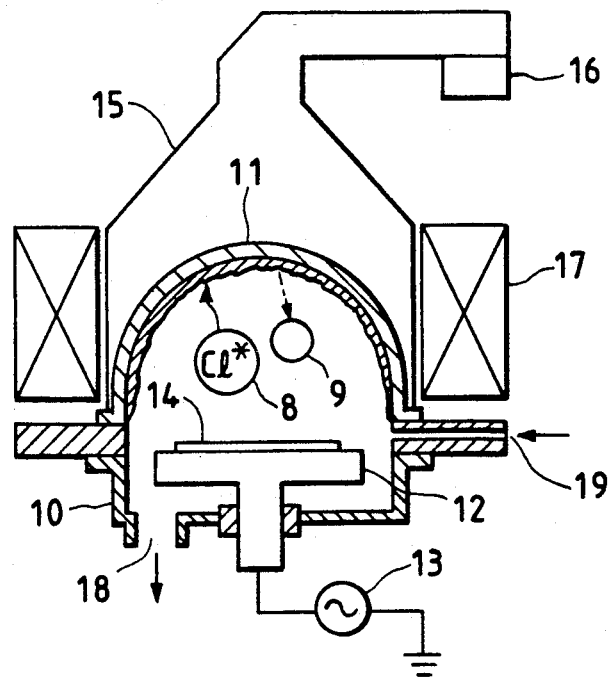

FIG. 3
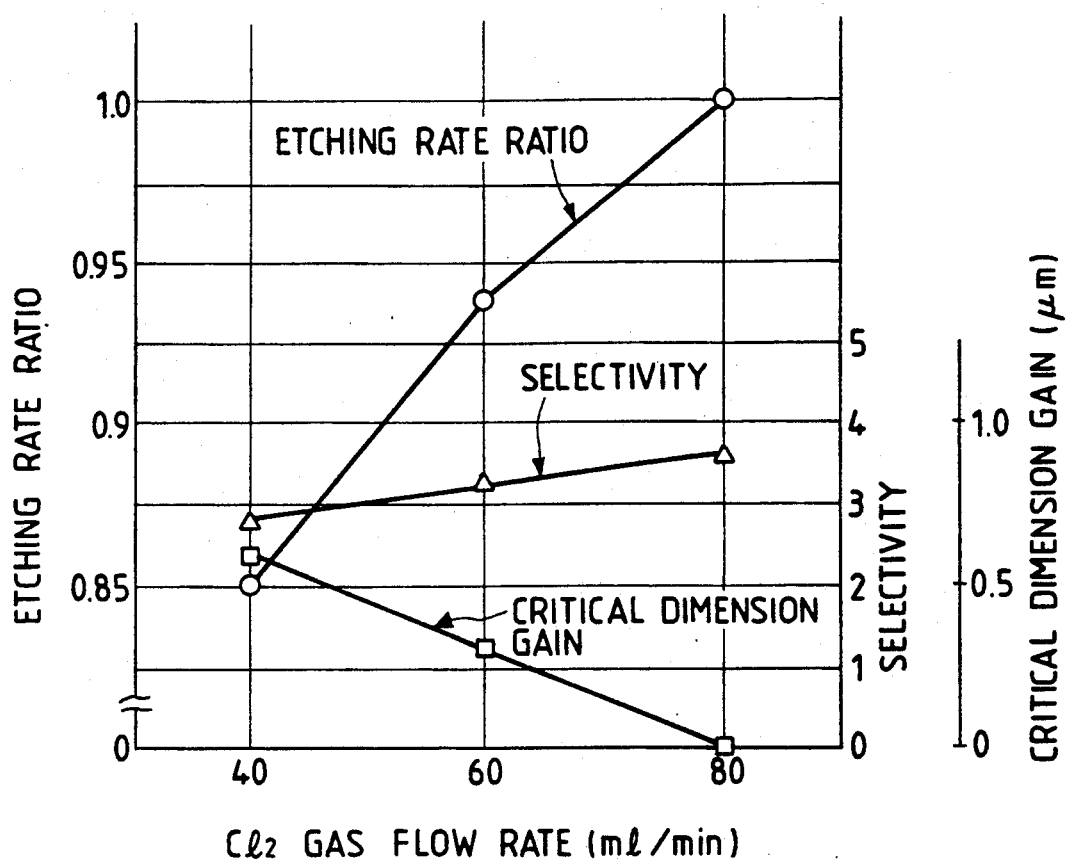
FIG. 4(a)   FIG. 5(a)   FIG. 6(a)
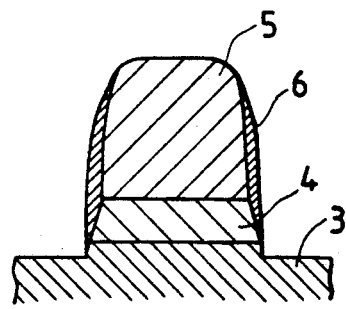 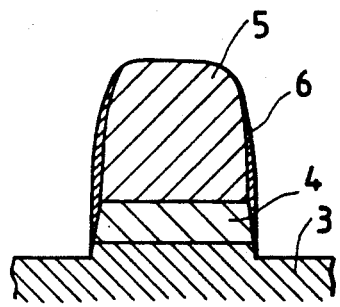 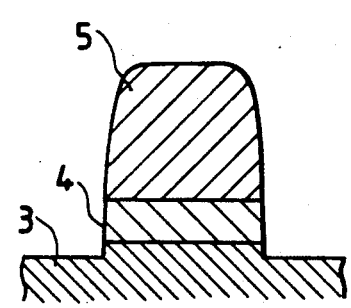
FIG. 4(b)   FIG. 5(b)   FIG. 6(b)
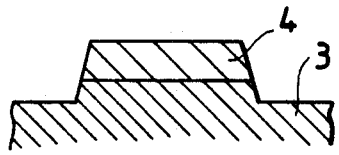 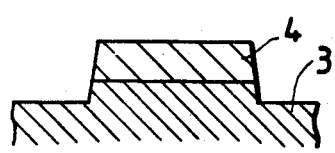 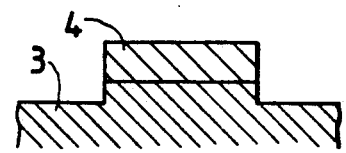

PROCESS FOR ETCHING

BACKGROUND OF THE INVENTION

1. Field of the Invention

The present invention relates to a process for etching and particularly to a process for etching suitable for use in the etching of a gate film, a tungsten alloy film, a silicon substrate, etc.

2. Description of the Prior Art

A gate film has hitherto been etched, for example, by a process disclosed in Japanese Patent Laid-Open No. 154730/1987 wherein the etching of a polycrystal silicon layer, i.e., a gate film, is conducted through the use of an etching gas comprising a mixture of $SF_6$ or $NF_3$ as an etching gas with $C_2Cl_3F_3$ (trade name: Flon 113) or Flon 114 (trade name) as a depositing gas.

On the other hand, a silicon substrate has been etched, for example, by a process disclosed in Japanese Patent Laid-Open No. 299343/1988 wherein the etching is conducted with a gas mixture of $NF_3$ or $SF_6$ as an etching gas with at least one of $CHF_3$, $CH_2F_2$, $CH_3F$, $C_2H_2F_2$, $C_2HF_3$, $C_2H_3F$, $C_2H_5F$ and $C_2H_4F_2$ as a depositing gas.

In the etching of a gate film in the above-described former prior art, gases subject to fluorocarbon gas regulations established in recent years, such as Flon 113 or Flon 114, are used, but these gases cannot be used in the future, so that it has become an urgent necessity to develop a process wherein use is made of a gas other than the above-described gas species subject to fluorocarbon gas regulations.

The latter prior art discloses the etching of a silicon substrate with a gas not subject to such regulations. In this process, although a damage to a silicon substrate in trench etching of silicon is taken into consideration, no consideration is given to an improvement in the etching performance and a reduction in the amount of deposits particularly in the fabrication of a gate film, so that no sufficient etching performance can be attained.

Specifically, as shown in FIGS. 10 (a) to (d), when a gate film is etched through the use of the conventional etching gas, gate formation proceeds as the etching proceeds. For example, a side wall film gradually deposits on the side wall of a $WSi_x$ film 4. The formed deposits 6 function as if they were a mask, and the width of the $WSi_x$ film 4 which is not removed is gradually increased. This causes the $WSi_x$ film 4 to be tapered as shown in FIG. 10 (e) when subjected to ashing to remove a mask 5, which makes it impossible to attain perpendicular etching. Further, deposition occurs also on the bottom to be etched, and this unfavorably inhibits an improvement in the etching rate.

SUMMARY OF THE INVENTION

A first object of the present invention is to provide a process for etching which can improve the etching performance without being subject to fluorocarbon gas regulations.

A second object of the present invention is to provide a process for etching which realizes anisotropic etching with good accuracy.

In order to attain the above-described first object, the process of the present invention comprises etching a gate film, a tungsten alloy film or a silicon substrate with an etching gas comprising a mixture of a reductive fluoride gas with a hydrocarbon gas and a halogen gas having a larger atomic diameter than a material to be etched, to thereby improve the etching performance without being subject to fluorocarbon gas regulations.

Further, in order to attain the above-described first object, the process of the present invention comprises etching a gate film, a tungsten alloy film or a silicon substrate with an etching gas comprising a mixture of a reductive fluoride gas with a hydrocarbon gas containing chlorine, to thereby improve the etching performance without being subject to fluorocarbon gas regulations.

In order to attain the above-described second object, the process of the prevent invention comprises the step of conducting anisotropic etching of a material to be etched with an etching gas, the step of forming a protective film by a depositing gas, and the step of removing excess deposits formed as the protective film by means of a gas reactive with the protective film, to thereby realize anisotropic etching with good accuracy.

BRIEF DESCRIPTION OF THE DRAWINGS

FIGS. 1(a) and 1(b) are diagrams showing a cross section of a material in the course of an etching treatment as one example of the process for etching according to the present invention;

FIG. 2 is a longitudinal sectional view of a microwave plasma etching apparatus as one example of an apparatus used for practicing the present invention;

FIG. 3 is a diagram showing a change in the etching performance when the flow rate of an etching gas is varied.

FIGS. 4(a) and 4(b) are diagrams showing cross sections of a material after etching and after ashing when a $Cl_2$ gas is added at a flow rate of 40 ml/min for etching;

FIGS. 5(a) and 5(b) are diagrams showing cross sections of a material after etching and after ashing when a $Cl_2$ gas is added at a flow rate of 60 ml/min for etching;

FIGS. 6(a) and 6(b) are diagrams showing cross sections of a material after etching and after ashing when a $Cl_2$ gas is added at a flow rate of 80 ml/min for etching;

DESCRIPTION OF THE PREFERRED EMBODIMENTS

Figure 7:
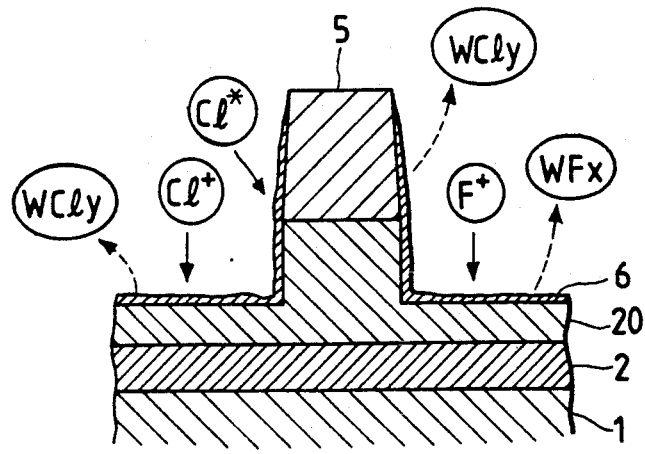
FIG. 7 is a diagram showing the state of etching of a tungsten film.

One example of the present invention will now be described in more detail with reference to FIGS. 1 to 6. FIGS. 1 (a) and (b) are diagrams showing the state of etching of a gate film through the generation of a plasma of an etching gas comprising a mixture of a reductive fluoride gas (e.g., $SF_6$) with a hydrocarbon gas (e.g., $CH_2F_2$) and a halogen gas having a larger atomic diameter than a material to be etched (e.g., $Cl_2$). In this case, the material to be etched is one prepared by forming a $SiO_2$ film 2 as an insulating film on a silicon substrate 1, successively superimposing thereon a polycrystal silicon film 3 and a $WSi_x$ film 4 and forming a mask 5 on the $WSi_x$ film 4.

During the etching of the above-described gate film, the gate film undergoes the action of the hydrocarbon gas as a depositing gas, and in the etching of the $WSi_x$ film 4 shown in FIG. 1 (a), deposits 6 (C, H, W, Cl, etc.) adhere to the surface of the material to be etched, i.e., the flat surface and side wall of the $WSi_x$ film 4 shown in the drawing. In the etching of the polycrystal silicon film 3 shown in FIG. 1 (b), deposits 6 (C, H, Si, Cl, etc.) adhere to the flat surface of the polycrystal silicon film 3 and the side walls of the $WSi_x$ film 4 and the polycrystal silicon film 3 shown in the drawing.

At that time, in the etching of the $WSi_x$ film 4 shown in FIG. 1 (a), the deposits 6 adherent to the flat surface of the $WSi_x$ film 4 and the flat surface of the $WSi_x$ film 4 are etched away in the form of $WF_x$ (wherein x = 1, 2, 3 ...) etc. (hereinafter referred to simply as "WFx") through the action of $SF_6$ as an etching gas, and the etching proceeds in the direction of depth. In the etching of the polycrystal silicon film 3 shown in FIG. 1 (b), the deposits 6 adherent to the flat surface of the polycrystal silicon film 3 and the flat surface of polycrystal silicon film 3 are etched away in the form of $SiF_x$ (wherein x = 1, 2, 3 ...) etc. (hereinafter referred to simply as "SiFx"), and the etching proceeds in the direction of depth.

Further, $Cl_2$ as the halogen gas having a larger atomic diameter than the material to be etched acts in such a manner that in the etching of the $WSi_x$ film 4 shown in FIG. 1 (a), mainly Cl ions 7 in a plasma impinge on the flat surface of the $WSi_x$ film 4 to react with the deposits 6 to produce CCl, HCl, $WCl_y$ (wherein y = 1, 2, 3 ...) (hereinafter referred to simply as "WCly"), etc., thereby promoting the removal of the deposits 6 to improve the rate of etching the material with $SF_6$. In the etching of the polycrystal silicon film 3 shown in FIG. 1 (b), Cl ions impinge on the flat surface of the polycrystal silicon film 3 to react with the deposits 6 to produce CCl, HCl, $SiCl_y$ (wherein y = 1, 2, 3 ...) (hereinafter referred to simply as "SiCly"), thereby promoting the removal of the deposits 6 to improve the rate of etching the material with $SF_6$.

In the etching of the $WSi_x$ film 4 shown in FIG. 1 (a), Cl radicals 8 in a plasma react with the deposits 6, which adhere to the side wall of the etching material to form a side wall film, to produce CCl, HCl, WCly, etc., thereby removing the deposits 6 so that no excess deposits 6 adhere to the side wall. In the etching of the polycrystal silicon film 3 shown in FIG. 1 (b), Cl radicals react with the deposits 6, which adhere to the side wall of the etching material to form a side wall film, to produce CCl, HCl, SiCly, etc., thereby removing the deposits 6 so that no excess deposits 6 adhere to the side wall. Thus, the deposits 6 shown in FIGS. 1 (a) and (b) are removed in the form of a chlorine compound 9.

The Cl ions 7 and Cl radicals 8 as well contribute to the etching of the WSix film 4 and polycrystal silicon film 3.

An embodiment of the apparatus used for the above-described etching is shown in FIG. 2.

A quartz discharge tube 11 is provided on top of an etching chamber 10 to form a vacuum etching chamber. The etching chamber 10 is provided with an etching gas inlet 19 connected to an etching gas supply source (not shown) for supplying an etching gas into the vacuum etching chamber, and an etching gas outlet 18 connected to a vacuum exhauster (not shown) for evacuating the inside of the vacuum etching chamber to a predetermined pressure. A sample piece support 12 for disposing thereon a wafer 14 as a material to be etched is provided within the etching chamber 10. A high-frequency power source 13 is connected to the sample piece support 12 so that a high-frequency power can be applied to the sample piece support 12. A waveguide 15 is provided outside the discharge tube 11 so that it surrounds the discharge tube 11. Further, a coil 17 for generating a magnetic field within the discharge tube 11 is provided outside the waveguide. A magnetron 16 for generating a micro-wave is provided at the terminal of the waveguide 15.

In the above-described apparatus, an etching gas is supplied into the vacuum etching chamber from the etching gas inlet 19, while the vacuum etching chamber is evacuated to a predetermined pressure. The microwave from the magnetron 16 is introduced through the waveguide 15 into the discharge tube 11, and a magnetic field is formed by means of the coil 17, so that a plasma is formed from the etching gas within the discharge tube 11 through the action of an electric field of the micro-wave and the magnetic field of the coil 17. Further, a high-frequency power is applied to the sample piece support 12 by the high-frequency power source 13 to generate a bias voltage. This draws the ions in the plasma towards the wafer 14 to conduct anisotropic etching.

The results of experiments on the etching of the above-described gate film by making use of the above-described apparatus are shown in FIGS. 3 to 6. In this case, the etching was conducted through the use of a polycrystal silicon film as the material to be etched, a gaseous mixture of $SF_6$ with $CH_2F_2$ and $Cl_2$ as the etching gas under conditions of cases 1 to 3 given in Table 1.

As is apparent from FIG. 3, when the flow rate of $Cl_2$ is increased in the order of cases 1, 2 and 3, the etching rate and selectivity increase while the critical dimension gain (etching bottom width minus mask width) reduces, i.e., the extent of tapering is suppressed. The etching rate ratio in FIG. 3 is based on the case where the gas flow rate of $Cl_2$ is 80 ml/min. The above effect is believed to be attained due to the fact that the deposits adherent to the etched surface and side wall are efficiently removed through the action of the Cl ions and Cl radicals as shown in FIG. 1 (b).

TABLE 1

|  | Case 1 | Case 2 | Case 3 |
|---|---|---|---|
| pressure |  | 0.01 Torr |  |
| micro-wave power | 2.45 GHz | 190 mA |  |
| high-frequency power | 2 MHz | 25 W |  |
| etching gas |  | ml/min |  |
| $SF_6$ |  | 10 |  |
| $CH_2F_2$ |  | 40 |  |
| $Cl_2$ | 40 | 60 | 80 |

FIG. 4 (a) is a diagram showing the shape of a cross section of the material to be treated shown in FIG. 1 when it is etched under conditions of case 1. FIG. 4 (b) is a diagram showing the shape of a cross section of the etched material when it is subjected to ashing to remove the mask 5.

FIG. 5 (a) is a diagram showing the shape of a cross section of the material to be treated shown in FIG. 1 when it is etched under conditions of case 2. FIG. 5 (b) is a diagram showing the shape of a cross section of the etched material when it is subjected to ashing to remove the mask 5. From these drawings, it is apparent that case 2 provides a better etching shape than case 1 does.

FIG. 6 (a) is a diagram showing the shape of a cross section of the material to be treated shown in FIG. 1 when it is etched under conditions of case 3. FIG. 6 (b) is a diagram showing the shape of a cross section of the etched material when it is subjected to ashing to remove the mask 5. From these drawings, it is apparent that case 3 provides a further better etching shape than case 2 does, i.e., a perpendicular etching.

As described above, according to the present invention, the use of $SF_6$ and $CH_2F_2$ in combination with $Cl_2$ as an etching gas in the etching of a gate film enables the adherence of excess deposits to be prevented, i.e., causes a $Cl_2$ gas to remove a film deposited on the surface of the material to be etched and an excessively adhered side wall film, which contributes to an improvement in the etching shape, i.e., an improvement in the accuracy and etching rate in anisotropic etching, so that it becomes possible to improve the etching performance.

Further, since the $Cl_2$ gas lowers the concentration of the reductive gas (S, C, H, etc.) which etches the underlying oxide film ($SiO_2$ film), i.e., Cl reacts with S, C, H, etc. to lower their concentrations, the etching rate of the $SiO_2$ film can be lowered, so that it becomes possible to improve the selectivity.

Further, according to the present invention, as shown in FIG. 2, the deposits adhered to the internal surface of the discharge tube 11 during etching can be removed also by the action of the Cl radicals, which enables the clouding of the discharge tube 11 to be prevented. This prevents a lowering in the quantity of light available for monitoring light emission in the plasma, so that the reproducibility in the detection of the end point of the etching can be favorably improved. Further, by virtue of an additional cleaning effect, the reproducibility of the etching is improved and the frequency of necessary cleaning can be reduced.

In the above-described embodiment, although only $SF_6$ was described as the reductive fluoride, the same effect can be attained when other reductive fluorides, e.g., $NF_3$, are used. Further, although only $CH_2F_2$ was described as the hydrocarbon gas, it is possible to use other hydrocarbon gases, e.g., $CHF_3$, $CH_3F$, $C_2H_2F_2$, $C_2HF_2$, $C_2H_3F$, $C_2H_5F$, $C_2H_4F_2$ and $C_2H_3F_3$. Further, although only $Cl_2$ was described as the halogen gas having a larger atomic diameter than the material to be etched, it is also possible to use $Br_2$, $I_2$, etc. In this case, Br ion and Br radical or I ion and I radical exhibit the same actions as those of the Cl ion and Cl radical, respectively.

In the above-described embodiment, a mixture comprising a reductive fluoride gas, a hydrocarbon gas and a halogen gas having a larger atomic diameter than a material to be etched was used as the etching gas. It is also possible to use a Cl-containing hydrocarbon gas instead of the hydrocarbon gas. The Cl-containing hydrocarbon gas may be used in the form of a mixture thereof with a reductive fluoride gas. In this case, the Cl contained in the hydrocarbon gas serves as the halogen gas having a larger atomic diameter than the material to be etched. Examples of the Cl-containing hydrocarbon gas include $CHClF_2$, $CHCl_2F$, $CH_3Cl$ and $CH_2Cl_2$.

Although, in the above-described embodiment, only $WSi_x$/polycrystal silicon film was described as the gate film, it is needless to say that the gate film may be a polycrystal silicon film alone. Further, a tungsten film as well may be used as the gate film. A description will now be made on the case where the gate film comprises a tungsten film.

FIG. 7 is a diagram showing the state of etching of a tungsten film. The etching gas used in this case is a gaseous mixture comprising $SF_6$, $CH_2F_2$ and $Cl_2$. The deposits in this case are compounds of tungsten, carbon, hydrogen, chlorine, etc. and removed in the form of WCl, CCl and HCl. The tungsten film is etched away in the form of $WF_y$ and $WCl_x$.

In the present embodiment, it is needless to say that etching can be conducted also when the $WSi_x$ film of the $WSi_x$/polycrystal silicon film is used in the form of a tungsten alloy film as a film other than the gate film. Further, it is also possible to etch a TiW film as another tungsten alloy film. Some examples in this case will now be described.

In the multilayer interconnection of an LSI, an aluminum or aluminum alloy film (Al-Si, Al-Cu-Si, Al-Ti-Si, etc.) has hitherto been employed. With an increase in the fineness, however, occurrence of breaking of an aluminum wiring due to stress migration, electro-migration, etc. has become a problem. In order to solve this problem, a laminate structure of an aluminum alloy and a barrier metal has come to be adopted. Examples of the barrier metal include tungsten alloy films such as $WSi_x$ and TiW. When this tungsten alloy film is fabricated with a chlorine or chlorine compound gas plasma (e.g., $BCl_3$, $SiCl_4$, $Cl_2$, etc.), the etching rate is reduced unfavorably. When it is fabricated with a $SF_6$ gas plasma, the etching becomes isotropic unfavorably although the etching rate can be improved.

Figure 8:
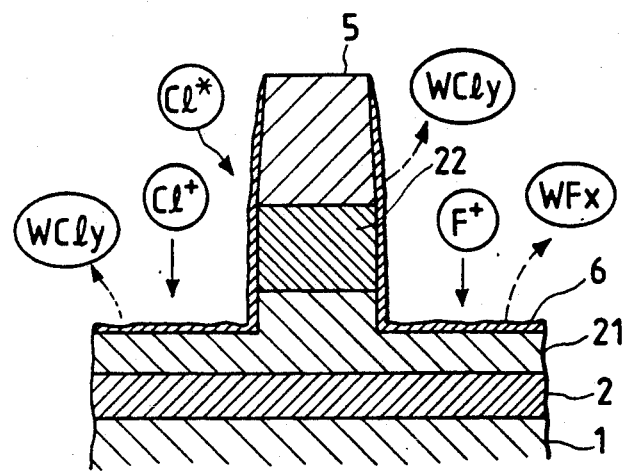
FIG. 8 is a diagram showing the state of etching of a tungsten alloy film.

By contrast, the tungsten alloy film as a barrier metal can be etched at a high speed with good anisotropy through the use of the etching gas in the present embodiment. FIG. 8 is a diagram showing the state of the tungsten alloy film during etching. In this case, the etching gas is a gaseous mixture comprising $SF_6$, $CH_2F_2$ and $Cl_2$. The deposits in this case are compounds of tungsten, carbon, hydrogen, chlorine, etc. and removed in the form of $WCl_y$, CCl and HCl. The tungsten alloy film is etched away in the form of $WF_x$ and $WCl_y$.

The etching gas in the present embodiment can etch a polycrystal silicon film and similarly be applied to the etching of a silicon substrate. The etching of the silicon substrate will now be described.

Figure 9:
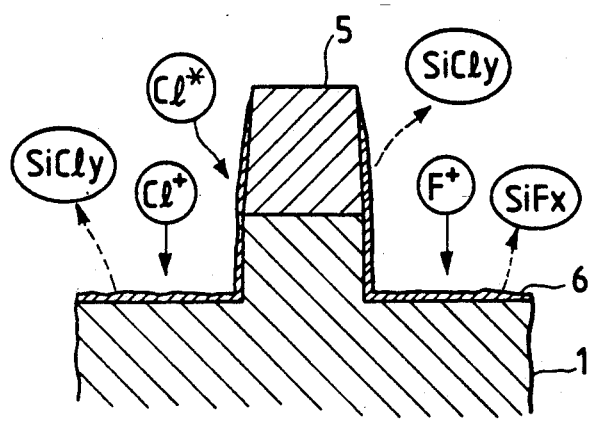
FIG. 9 is a diagram showing the state of etching of a silicon substrate.
Figure 10A:
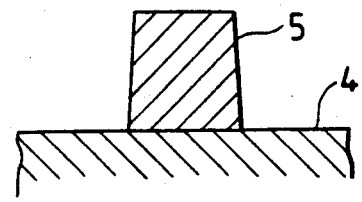
FIGS. 10(a)–10(e) are diagrams showing cross sections of a material before etching, in the course of etching and after etching when the etching is conducted by the conventional process.
Figure 10B:
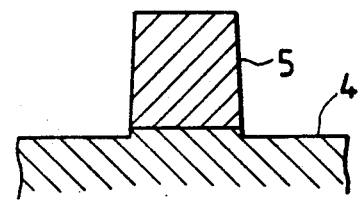
Figure 10C:
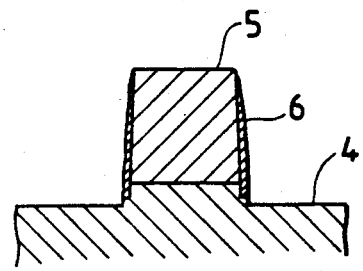
Figure 10D:
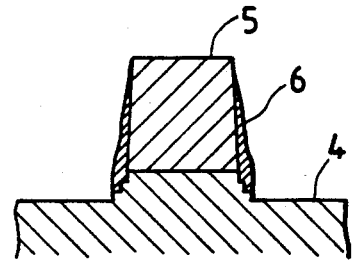
Figure 10E:
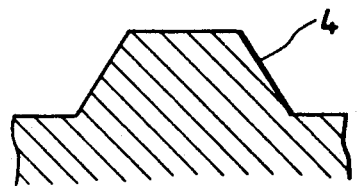

FIG. 9 is a diagram showing the state of etching of a silicon substrate. In this case, the etching gas is a gaseous mixture comprising $SF_6$, $CH_2F_2$ and $Cl_2$. The deposits in this case are compounds of silicon, carbon, hydrogen, chlorine, etc. and removed in the form of $SiCl_y$, CCl and HCl. The silicon substrate is etched away in the form of $SiF_x$ and $SiCl_y$.

As described above, according to the present invention, when a mixture comprising a reductive fluoride gas, a hydrocarbon gas and a halogen gas having a larger atomic diameter than the material to be etched, or a mixture comprising a reductive fluoride gas and a Cl-containing hydrocarbon gas is used as an etching gas in the etching of a gate film, a tungsten alloy film or a silicon substrate, deposits adhere to an etching surface and a side wall as a protective film by the action of the hydrocarbon gas as a depositing gas. In this state, the deposits adherent to the etching surface of the material to be etched and the etching surface of the material to be etched are subjected to anisotropic etching by the action of the reductive fluoride gas as an etching gas, and the deposits (deposited film) adherent to the surface of the material to be etched, i.e., etching surface, and excessive deposits (side wall film) adherent to the side wall are removed by the action of chlorine contained in the halogen gas and hydrocarbon gas. Thus, the present invention has the effect of improving the etching rate and enabling anisotropic etching to be conducted with good dimensional accuracy, so that the etching performance can be improved without being subject to fluorocarbon gas regulations.

Further, in the process of the present invention comprising the step of conducting anisotropic etching of a material to be etched with an etching gas, the step of forming a protective film by a depositing gas and the step of removing excess deposits formed as the protective film by means of a gas reactive with the protective film, anisotropic etching is conducted by forming a protective film on a side wall while removing excess deposits formed as the protective film, so that the anisotropic etching can be favorably conducted with good accuracy.

What is claimed is:

1. A process for etching which comprises etching at least one material selected from the group consisting of a polycrystal silicon film, a tungsten alloy film, a tungsten film and a silicon substrate by using, as an etching gas, a mixture comprising a reductive fluoride gas, a hydrocarbon gas and a halogen gas having a larger atomic diameter than that of the material to be etched.

2. A process for etching according to claim 1, wherein said reductive fluoride gas is $SF_6$ or $NF_3$.

3. A process for etching according to claim 1, wherein said hydrocarbon gas is $CHF_3$, $CH_2F_2$, $CH_3F$, $C_2H_2F_2$, $C_2HF_2$, $C_2H_3F$, $C_2H_5F$, $C_2H_4F_2$ or $C_2H_3F_3$.

4. A process for etching according to claim 1, wherein said halogen gas is $Cl_2$, $Br_2$, or $I_2$.

5. A process for etching according to claim 1, wherein said at least one material is a $WSi_x$/polycrystal silicon film or a polycrystal silicon film or a tungsten film, said etching being performed so as to form a gate film.

6. A process for etching according to claim 1, wherein said tungsten alloy film is a $WSi_x$ film or a TiW film.

7. A process for etching according to claim 1, wherein the etching is conducted by means of a microwave plasma through the application of a high-frequency power to a sample piece support on which the material to be etched is placed.

8. A process for etching which comprises etching at least one material selected from the group consisting of a polycrystal silicon film, a tungsten alloy film, a tungsten film and a silicon substrate by using a mixture composed of a reductive fluoride gas and a Cl-containing hydrocarbon gas as an etching gas.

9. A process for etching according to claim 8, wherein said reductive fluoride gas is $SF_6$ or $NF_3$.

10. A process for etching according to claim 8, wherein said Cl-containing hydrocarbon gas is $CHClF_2$, $CHCl_2F$, $CH_3Cl$ or $CH_2Cl_2$.

11. A process for etching according to claim 8, wherein said at least one material is a $WSi_x$/polycrystal silicon film, a polycrystal silicon film or a tungsten film, said etching being performed so as to form a gate film.

12. A process for etching according to claim 8, wherein said tungsten alloy film is a $WSi_x$ film or a TiW film.

13. A process for etching according to claim 8, wherein the etching is conducted by means of a microwave plasma through the application of a high-frequency power to a sample piece support on which the material to be etched is placed.

14. A process for etching a material to be etched, using a gas plasma, which comprises the step of conducting, with an etching gas, anisotropic etching of the material to be etched, the step of forming a protective film by a depositing gas, and the step of removing excess deposits formed as the protective film by means of a gas reactive with the protective film.

15. A process for etching according to claim 14, wherein all of said steps are conducted at once.

16. A process for etching according to claim 14, wherein said material to be etched is a tungsten film or a silicon substrate.

17. A process for etching according to claim 14, wherein a reductive fluoride gas, a hydrocarbon gas and a halogen gas having a larger atomic diameter than the material to be etched are used respectively as said etching gas, said depositing gas and said gas reactive with the protective film.

18. A process for etching according to claim 14, wherein a reductive fluoride gas is used as said etching gas and a Cl-containing hydrocarbon gas is used as both said depositing gas and said gas reactive with the protective film.

19. A process for etching according to claim 14, wherein the etching is conducted by means of a microwave plasma through the application of a high-frequency power to a sample piece support on which the material to be etched is placed.

20. A process for etching according to claim 1, wherein the etching is an anisotropic etching.

21. A process for etching according to claim 1, wherein, during the etching, the halogen gas having a larger atomic diameter than the material to be etched removes a deposit formed on side and bottom walls of the material to be etched.

22. A process for etching according to claim 21, wherein said deposit is removed in the form of a chlorine compound.

23. A process for etching according to claim 7, wherein the sample piece support is provided in an etching chamber, a discharge tube forming a top of the etching chamber, and wherein during the etching the halogen gas having a larger atomic diameter than the material to be etched removes a deposit formed on the discharge tube.

24. A process for etching according to claim 14, wherein the material to be etched is a barrier metal of a multilayer interconnection of an integrated circuit, said anisotropic etching being performed so as to form a barrier layer of a laminate wiring structure of the multilayer interconnection.

25. A process for etching according to claim 14, wherein said etching is performed so as to form a gate film.

26. A process for etching according to claim 8, wherein said etching is performed so as to form a gate film.

27. A process for etching according to claim 1, wherein said etching is performed so as to form a gate film.

* * * * *